(12) United States Patent
Popov et al.

(10) Patent No.: US 6,879,287 B2
(45) Date of Patent: Apr. 12, 2005

(54) PACKAGED INTEGRATED ANTENNA FOR CIRCULAR AND LINEAR POLARIZATIONS

(75) Inventors: Alexander Pavlovich Popov, Kingston (CA); Mihai Dragos Rotaru, Singapore (SG); Mahadevan Krishna Iyer, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 3 days.

(21) Appl. No.: 10/445,091

(22) Filed: May 24, 2003

(65) Prior Publication Data

US 2004/0233107 A1 Nov. 25, 2004

(51) Int. Cl.$^7$ ................................................. H01Q 1/38
(52) U.S. Cl. ............................................... 343/700 MS
(58) Field of Search .................... 343/700 MS, 785, 343/702, 829, 873, 846, 848

(56) References Cited

U.S. PATENT DOCUMENTS

| | | | |
|---|---|---|---|
| 5,940,036 A | 8/1999 | Oliver et al. | 343/700 MS |
| 5,952,972 A * | 9/1999 | Ittipiboon et al. | 343/700 MS |
| 6,147,647 A | 11/2000 | Tassoudji et al. | 343/700 MS |
| 6,198,450 B1 | 3/2001 | Adachi et al. | 343/753 |
| 6,292,141 B1 * | 9/2001 | Lim | 343/700 MS |
| 6,323,824 B1 | 11/2001 | Heinrichs et al. | 343/846 |
| 6,344,833 B1 | 2/2002 | Lin et al. | 343/846 |
| 6,407,718 B2 | 6/2002 | Adachi et al. | 343/878 |
| 6,531,991 B2 | 3/2003 | Adachi et al. | 343/911 R |
| 2002/0072147 A1 * | 6/2002 | Sayanagi et al. | 438/106 |
| 2003/0043075 A1 * | 3/2003 | Bit-Babik et al. | 343/700 MS |
| 2003/0142019 A1 * | 7/2003 | Hilgers | 343/700 MS |

OTHER PUBLICATIONS

Song, C.T. P. et al. "Packaging technique forgain enhancement of electrically small antenna designed ongallium arsenide", *Electronics Letters*, vol. 36, Issue 18, Aug. 31, 2000, pp. 1524–1525.

Petosa, A. et al., "Recent Advances in Dielectric–Resonator Antenna Tech.", *IEEE Antennas and Propagation Mag.*, vol. 40, No. 3, pp. 35–48, Jun. 1998.

Leung, K.W. et al., "Circular–polarised dielectric resonator antenna excited by dual conformal strips," *Electronics Letters*, vol. 36, Issue 6, Mar. 16, 2000, pp. 484–486.

Long, R.T. et al., "Use of parasitic strip to produce circular polarization and increased bandwidth for cylindrical dielectric antenna," *Elec. Letters*, vol. 37, Issue 7, Mar. 29, 2001, pp. 406–408.

Esselle, K.P. "Circularly polarized higher order rectangular dielectric–resonator antenna," *Elec. Letters*, vol. 32, Issue 3, Feb. 1, 1996, pp. 150–151.

Kishk, A.A. et al., "Conical Dielectric Resonator Antennas for Wide–Band Applications," *Antennas and Propagation, IEEE Trans.*, vol. AP-50, Issue 4, Apr. 2002, pp. 469–474.

Kishk, A.A. et al., "Analysis of Dielectric–Resonator Antennas with Emphasis on Hemispherical Structures," *IEEE Antennas and Propagation Mag.*, vol. 36, Issue 2, Apr. 1994, pp. 20–31.

* cited by examiner

*Primary Examiner*—Don Wong
*Assistant Examiner*—Huedung X. Cao
(74) *Attorney, Agent, or Firm*—George O Saile; Stephen B. Ackerman; Rosemary L.S. Pike (57) ABSTRACT

A high radiation efficiency antenna system in a package is achieved by the provision of a Dielectric Resonator Package. A Dielectric resonator package comprises a dielectric body of the package forming a dielectric resonator that resonates at radio frequency and a feed substrate having an upper and a lower surface, a feed structure formed on the upper surface of the feed substrate, and RF circuitry mounted on the lower surface of the feed substrate. The feed substrate is attached to the dielectric body of the package from the side of the feed structure.

25 Claims, 7 Drawing Sheets

PACKAGED INTEGRATED ANTENNA FOR CIRCULAR AND LINEAR POLARIZATIONS

BACKGROUND OF THE INVENTION (1) Field of the Invention

The invention relates to the dielectric resonator antennas and, more particularly, to packaged dielectric resonator antennas having circular and linear polarizations and high radiator efficiency.

(2) Description of the Prior Art

Figure 1:
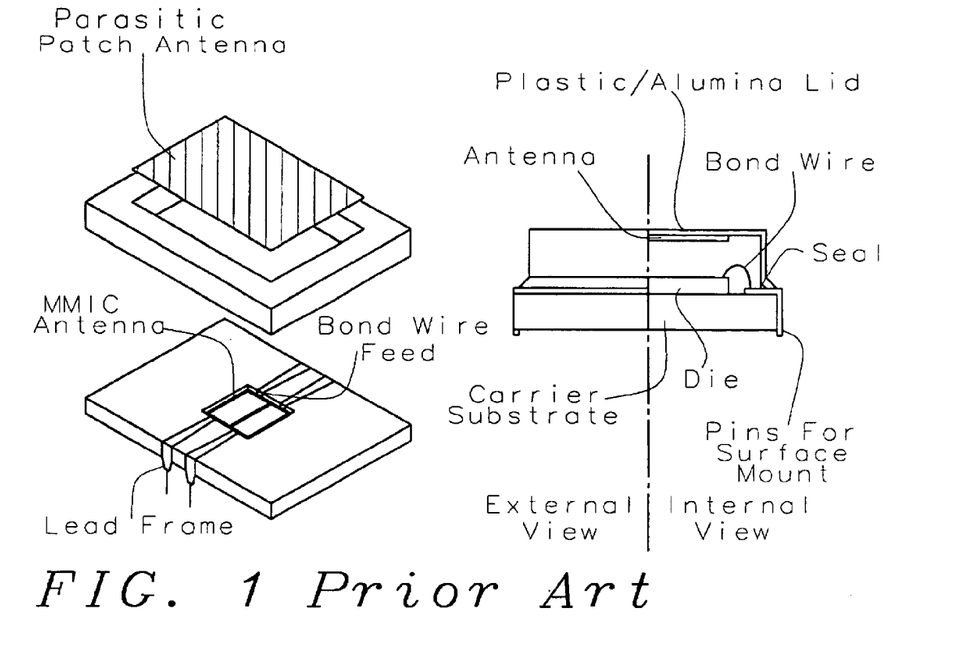
FIG. 1 illustrates in oblique and cross-sectional representations a packaged antenna of the prior art having a parasitic radiator.
Figure 2:
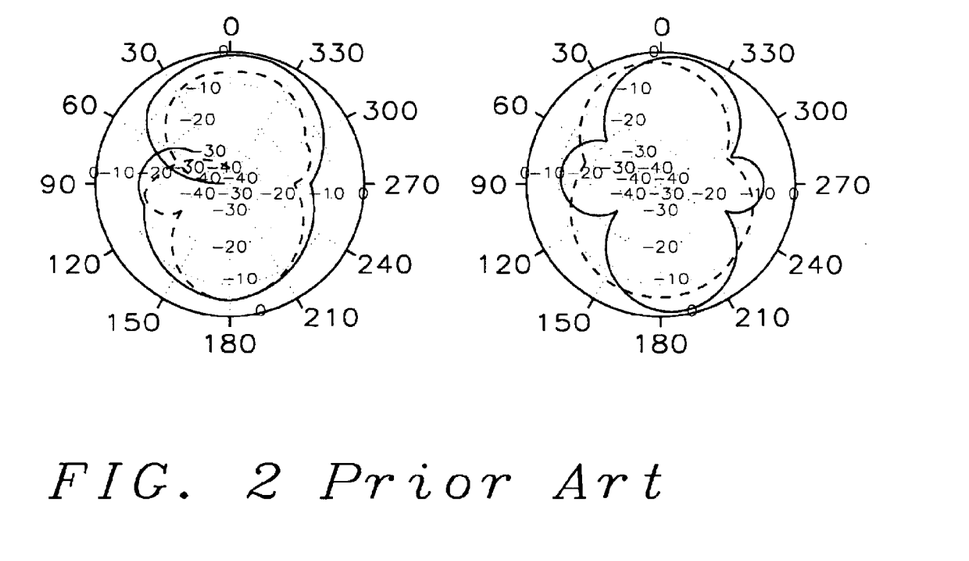
FIG. 2 graphically illustrates the measured pattern of the prior art antenna system in FIG. 1.

Design of compact and fully integrated antennas is a major challenge in the development of modern radio frequency (RF) front end products for wireless communications. Due to natural physical limitations on the RF system dimensions, an integrated antenna has, as usual, small electrical size and must operate with a finite "ground plane", which has a great influence on the return loss and may result in a low forward-to-backward ratio. The conventional integrated patch antennas suffer from low radiation efficiency, high sensitive fabrication tolerances, and narrow bandwidth. In particular, in Song, C. T. P. et al, "Packaging technique for gain enhancement of electrically small antenna designed on gallium arsenide", *Electronics Letters*, Vol. 36, Issue 18, 31 Aug. 2000, pp. 1524–1525, an antenna system in a package consisting of a printed feed with a parasitic radiator (FIG. 1) was proposed. The antenna system in the package has the overall dimensions of 20×20×8 mm and provides linear polarization radiation at a frequency of 5.8 GHz. The drawbacks of this solution are mainly the narrow impedance bandwidth of 0.67% and relatively high return loss of −6 dB within the operating bandwidth. The paper's proposed solution also exhibits low forward-to-backward ratio (FIG. 2) that may result in a feedback to the sensitive circuitry of the RF system.

Dielectric resonator antennas have better radiation efficiency and polarization selectivity than patch antennas and even may be designed with smaller dimensions if the material of the dielectric resonator has a high dielectric constant. In particular, dielectric resonator antennas operating at linear and circular polarization with rectangular, cylindrical, conical, and hemispherical dielectric resonators have been disclosed in the following references: Petosa, A.et al, "Recent advances in dielectric-resonator antenna technology", *IEEE Antennas and Propagation Magazine*, Vol. 40, no.3, pp.35–48, June 1998; Leung, K. W. et al, "Circular-polarized dielectric resonator antenna excited by dual conformal strips", *Electronics Letters*, Vol. 36, Issue 6, 16 Mar. 2000, pp.484–486; Long, R. T. et al, "Use of parasitic strip to produce circular polarization and increased bandwidth for cylindrical dielectric resonator antenna", *Electronics Letters*, Vol. 37, Issue 7, 29 Mar. 2001, pp. 406–408; Esselle, K. P, "Circularly polarized higher-order rectangular dielectric-resonator antenna", *Electronics Letters*, Vol. 32, Issue 3, 1 Feb. 1996, pp.150–151; Kishk, A. A. et al, "Conical dielectric resonator antennas for wideband applications", *Antennas and Propagation, IEEE Trans.*, Vol. AP-50 Issue 4, April, 2002, pp. 469–474; and Kishk, A. A. et al, "Analysis of dielectric-resonator antennas with emphasis on hemispherical structures", *IEEE Antennas and Propagation Magazine*, Vol. 36, Issue 2, April, 1994, pp. 20–31.

However, the solutions for integrated dielectric resonator antennas in RF systems in packages have not yet been disclosed. Also, the available feed designs for dielectric resonator antennas with circular/linear polarized radiation are not convenient for the antenna integration in RF systems in packages and have some drawbacks in terms of available bandwidth and limitations on the ground plane size. For example, some of these feed designs are disclosed in U.S. Pat. Nos. 6,198,450, 6,531,991, and 6,407,718 all to Adachi et al.

In particular, for linear polarized radiation of a dielectric resonator antenna there were proposed feeds in the form of probes, printed electric/magnetic dipoles and electric/magnetic loops (Petosa et al). The drawbacks of this solution are the requirement of drilling holes in the dielectric resonator, difficulties of the antenna integration, and/or narrow impedance bandwidth achievable.

Figure 3:
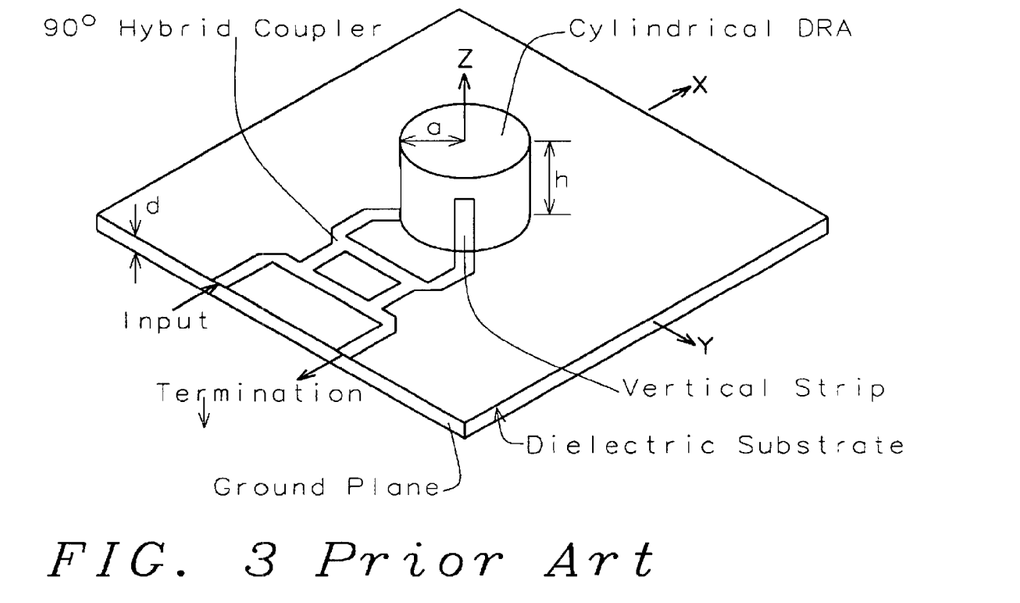
FIG. 3 is an oblique representation of a second antenna design of the prior art.

To form a circular polarized radiation in a dielectric resonator antenna it is necessary to excite at least two orthogonal modes with a phase shift of 90°. To achieve this goal in Leung et al, a feed comprising two orthogonal dipoles (electric or magnetic) is fed through a circuitry that splits equally the RF power between the dipoles and introduces an additional phase shift of 90° for one of the dipoles. The drawbacks of this solution are a complicated feed design and higher losses in the splitter (FIG. 3) and phase shifting circuitry. Also, the power splitting and phase shifting circuitry requires considerable space on the printed circuit board (PCB) and thus complicates the antenna integration into the RF system in the package. U.S. Pat. No. 5,940,036 to Oliver et al shows a single feed having two mutually orthogonal modes. U.S. Pat. No. 6,147,647 to Tassoudji et al, U.S. Pat. No. 6,344,833 to Lin et al, and U.S. Pat. No. 6,292,141 to Lim describe conductive strips formed orthogonally with respect to the ground plane to provide circularly polarized radiation in a dielectric resonator antenna (DRA).

Figure 4:
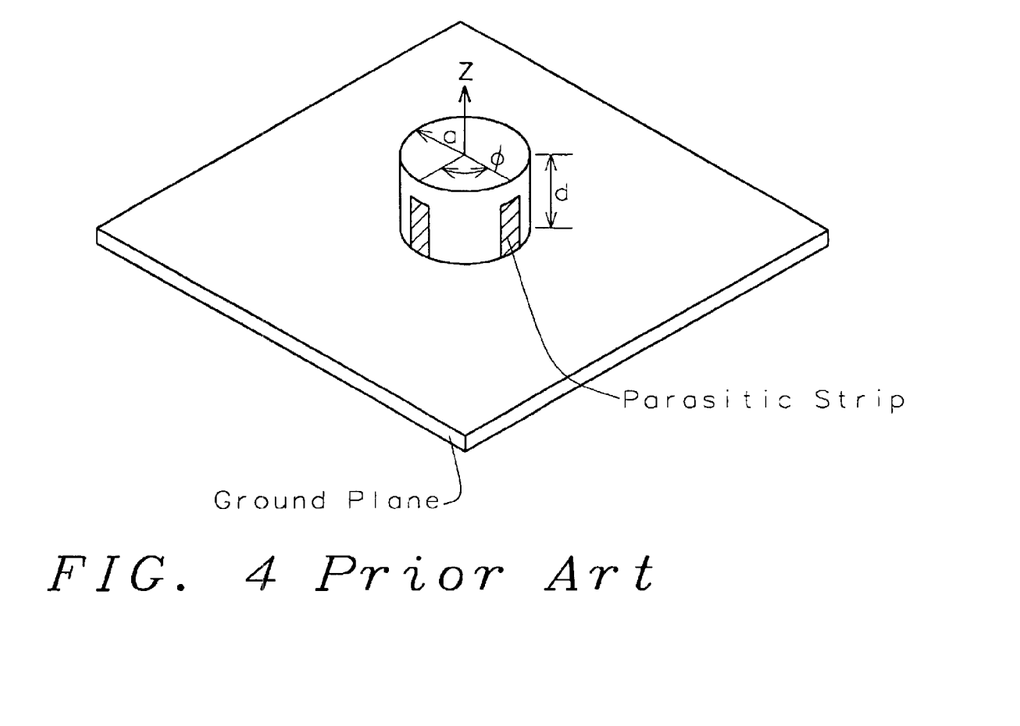
FIG. 4 is an oblique representation of a third antenna design of the prior art.

To simplify the feed and to reduce losses, it was proposed in Long et al to use additional metallization of the resonator in the form of strips to shift the resonator frequency of the orthogonal mode, so that it would acquire the additional phase shift of 90° when excited at the frequency close to the resonant one (FIG. 4). The drawback of this solution is the requirement for the dielectric resonator metallization and difficulties in the antenna tuning to compensate for the fabrication tolerances.

Figure 5:
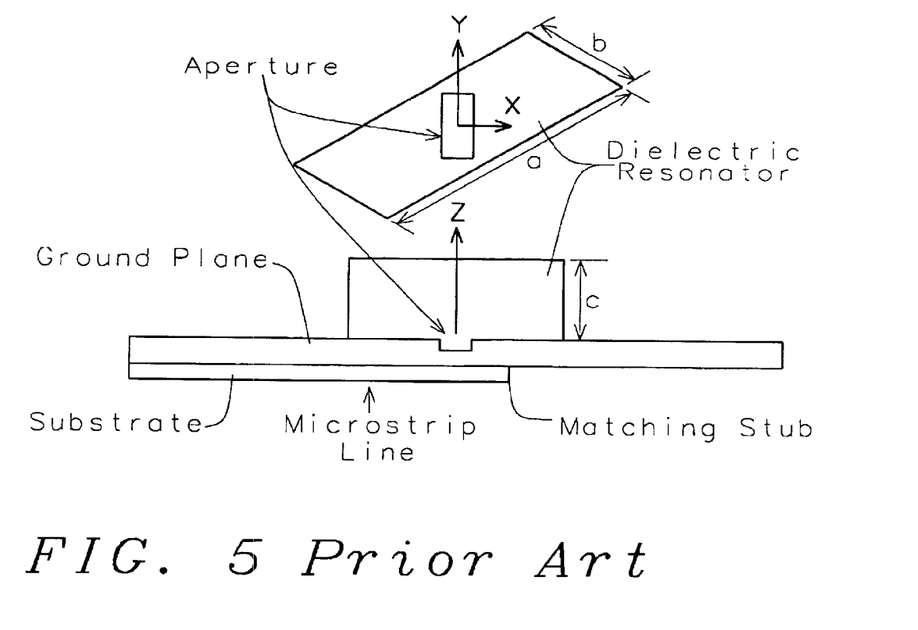
FIG. 5 is a top view and a cross-sectional representation of a fourth antenna design of the prior art.

To solve this problem, in Esselle et al it was proposed to use a rectangular resonator with different sides. In this case, the resonator shape may be chosen so that the orthogonal modes will have slightly different resonant frequencies thus providing an opportunity to form circular polarized radiation from the antenna (FIG. 5). The drawback of this solution is a strict limitation on dielectric resonator fabrication tolerances and a limited bandwidth for an acceptable level of the axial ratio of the antenna. U.S. Pat. No. 6,323,824 to Heinrichs et al shows a rectangular resonator mounted on a printed circuit board.

SUMMARY OF THE INVENTION

The principal objective of the present invention is to provide a dielectric resonator antenna in a radio frequency system package.

Another objective of the invention is to provide a packaged integrated antenna for circular and linear polarizations.

Yet another objective is to provide a packaged integrated dielectric resonator antenna wherein the antenna feed is integrated with the RF circuitry.

A further objective of the invention is to achieve a high radiation efficiency antenna system in a package having a wide impedance bandwidth.

Yet another objective of the invention is to provide circular polarized radiation from a dielectric resonator antenna with a simple feed design.

Yet another objective of the invention is to provide circular polarized radiation from a dielectric resonator antenna with a simple feed design where the feed and the dielectric resonator are formed on the same plane.

A still further objective is to provide a linear polarized radiation from a dielectric resonator antenna.

Yet another objective is to provide a linear polarized radiation from a dielectric resonator antenna and to achieve a wider impedance bandwidth with a simple feed design.

In accordance with the objectives of the invention, a high radiation efficiency antenna system in a package is achieved by the provision of a Dielectric Resonator Package. A Dielectric resonator package comprises a dielectric body of the package forming a dielectric resonator that resonates at radio frequency and a feed substrate having an upper and a lower surface, a feed structure formed on the upper surface of the feed substrate, and RF circuitry mounted on the lower surface of the feed substrate. The feed substrate is attached to the dielectric body of the package from the side of the feed structure.

Also in accordance with the objectives of the invention, a circular polarized radiation dielectric resonator antenna with a simple feed design is achieved. The dielectric resonator antenna comprises a feed substrate having an upper and a lower surface, a first ground plane formed on the upper surface of the feed substrate and a second ground plane formed on the lower surface of the feed substrate, a dielectric resonator attached to the first ground plane, an asymmetrical feed structure formed on the first ground plane wherein the asymmetrical feed structure excites modes in the dielectric resonator in orthogonal directions to provide circular polarized radiation, and radio frequency circuitry mounted on the lower surface of the feed substrate and coupled to the feed structure.

Also in accordance with the objectives of the invention, a linear polarized radiation dielectric resonator antenna with a simple feed design is achieved. The dielectric resonator antenna comprises a feed substrate having an upper and a lower surface, a first ground plane formed on the upper surface of the feed substrate and a second ground plane formed on the lower surface of the feed substrate, a dielectric resonator attached to the first ground plane, a feed structure formed on the first ground plane wherein the feed structure comprises both magnetic and electric dipoles to provide linear polarized radiation, and radio frequency circuitry mounted on the lower surface of the feed substrate and connected to the feed structure by a via through the feed substrate.

BRIEF DESCRIPTION OF THE DRAWINGS

In the accompanying drawings forming a material part of this description, there is shown.

DESCRIPTION OF THE PREFERRED EMBODIMENTS

A conventional radio frequency (RF) package serves to protect RF circuitry inside the package from the environment hazards, for thermal management and to provide an electrical interface of the RF circuitry inside the package to the rest of the system. Conventional design rules for an RF package are to minimize the package influence on the electrical parameters of the RF circuitry inside the package. In the prior art paper by Song et al, the package is used for a mechanical support of a parasitic element of the antenna system, thus serving as a conventional package only.

In the proposed Dielectric resonator package concept a package performs a double function. It serves as a conventional package and as a radiating element as well. In spite of the fact that a conventional RF package may exhibit weak radiation of electromagnetic energy, it is not obvious that an RF package may be used also as an effective integrated antenna. It is not also obvious how to design a package that could be an efficient antenna with a specified radiating pattern. Unique to the present invention is the use of an RF package as an integrated antenna system and a particular use of a dielectric resonator in the design of an RF package to achieve a specified radiation pattern, high radiation efficiency, and wide bandwidth.

To overcome some difficulties in design and miniaturization of integrated antennas, an RF System in Dielectric Resonator Package Concept is proposed. A part of the RF chip package is designed to operate as a dielectric resonator antenna (DRA) with high value of dielectric constant, while the antenna feed is integrated with the rest of the circuitry forming an RF Micro Module (see FIGS. 6A and 7). The shape of a dielectric resonator package and a particular feed structure is chosen to provide a specified circular/linear radiation, required bandwidth of operation, and to meet some technological and standard requirements.

A first objective to achieve high radiation efficiency of an antenna system in a package with a wide impedance bandwidth. This objective is achieved by the provision of a dielectric resonator package that is used as a radiating element forming the antenna radiation pattern. The operating modes excited in the resonator determine the antenna polarization selectivity and radiation pattern. The dielectric resonator with high dielectric constant that is used as a package/part of a package of the RF system can be designed as a stand alone package (FIGS. 6A and 6B) or it may be fixed directly on the substrate (FIG. 7).

Figure 6A:
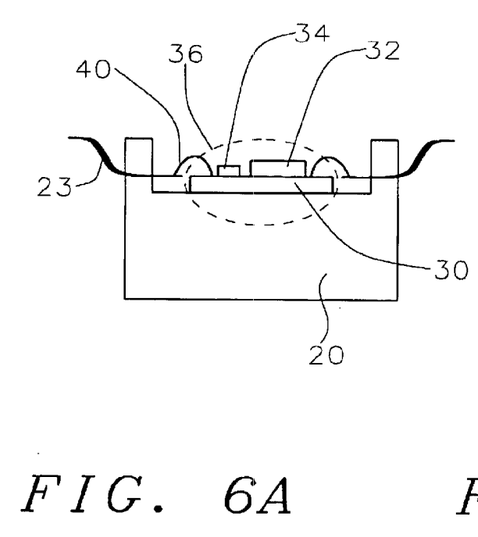
FIGS. 6A and 6B are cross-sectional representations of a dielectric resonator package of the present invention showing the inside and outside of the package, respectively.
Figure 6B:
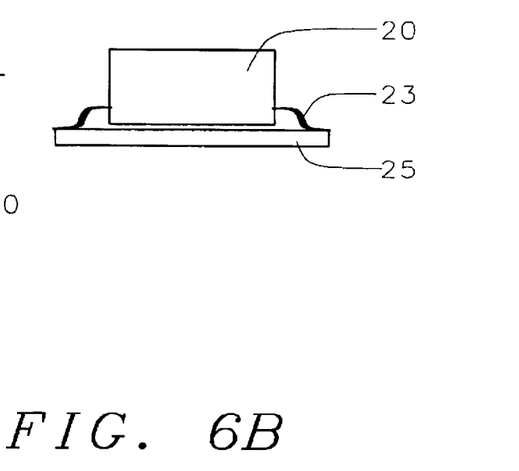

Referring now more particularly to FIG. 6B, there is shown a stand alone dielectric resonator package 20 on a printed circuit board (PCB) 25. Leads 23 connect the dielectric resonator package to the printed circuit board. FIG. 6A shows a cut-away inside view of the dielectric resonator package of the present invention. Connections to the PCB are not shown in FIG. 6A. A stand alone device may be connected to the PCB as it shown in FIG. 6B. Also a stand alone device may be connected to the power supply by wires, so, the use of the PCB is not required in some cases.

The body of the dielectric resonator package 20 is designed to resonate at radio frequency. So, the dielectric body of the dielectric resonator package acts as a dielectric resonator. Thus it combines the function of a conventional RF package and a dielectric resonator forming an essential part of the antenna system. The feed structure is fabricated on the upper side of the feed substrate 30. The feed structure is a printed circuit designed to excite the dielectric resonator. RF circuitry comprises RF chips, RF components module, subsystems, etc. The RF chip 32 and the other components of the system 34 are mounted on the lower side of the feed substrate forming the RF micromodule 36. The ground plane conductor on the lower side of the feed substrate acts as an electromagnetic (EM) shield reducing the EM feed back on the RF sensitive circuitry (RF chip, Digital signal processing chip, and other RF components) and minimizing the EM interference. The shape of dielectric resonator used in the proposed package can be either symmetrical (square, cylindrical, hemispherical, etc.) or asymmetrical (rectangular, ellipsoidal, etc.). An example of wire bonding of the RF chip 32 to the dielectric resonator package is shown. Thin lines 40 are wire bonding of the RF chip pads to the package leads. However, a particular chip connection may be done using a flip chip technology as well.

Figure 7:
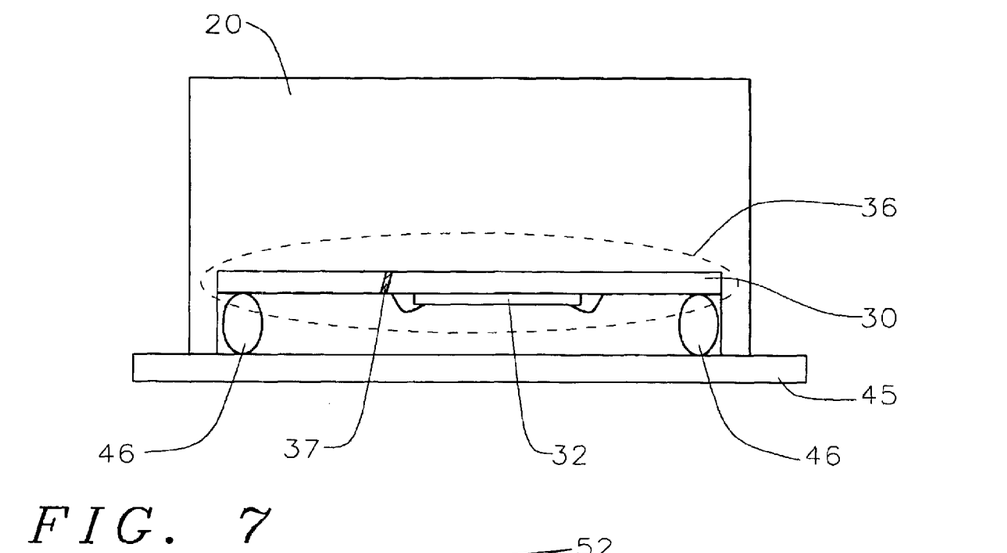
FIG. 7 is a cross-sectional representation of a dielectric resonator package of the present invention on a printed circuit board.

FIG. 7 shows the dielectric resonator package 20 mounted on a printed circuit board 45. The RF chip 32 and the other components of the system (not shown here, but as shown as 34 in FIG. 6A) are mounted on the lower side of the feed substrate forming the RF micromodule 36. The RF input/output connection 37 is shown as a via through the feed substrate. The lower ground plane has a hole centered with the via hole to avoid a short circuit between the ground plane and the via. The via 37 has metallization to provide an electrical contact between the feed structure and RF out/in of the RF circuitry mounted on the lower side of the feed substrate.

Connectors 46 connect the RF micromodule to the printed circuit board 45. The dielectric resonator 20 in this embodiment may also have either a symmetrical or an asymmetrical shape.

A second objective of this invention is to provide circular polarized radiation from a dielectric resonator antenna with a simple feed design in which the feed structure and a dielectric resonator are formed on the same plane and the fabrication tolerances of the resonator can be compensated with an appropriate feed design.

Figure 8A:
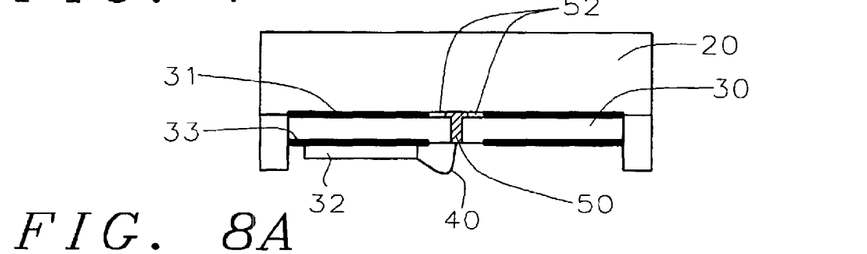
FIG. 8A is a cross-sectional representation of a dielectric resonator antenna with circular polarization of the present invention.
Figure 8B:
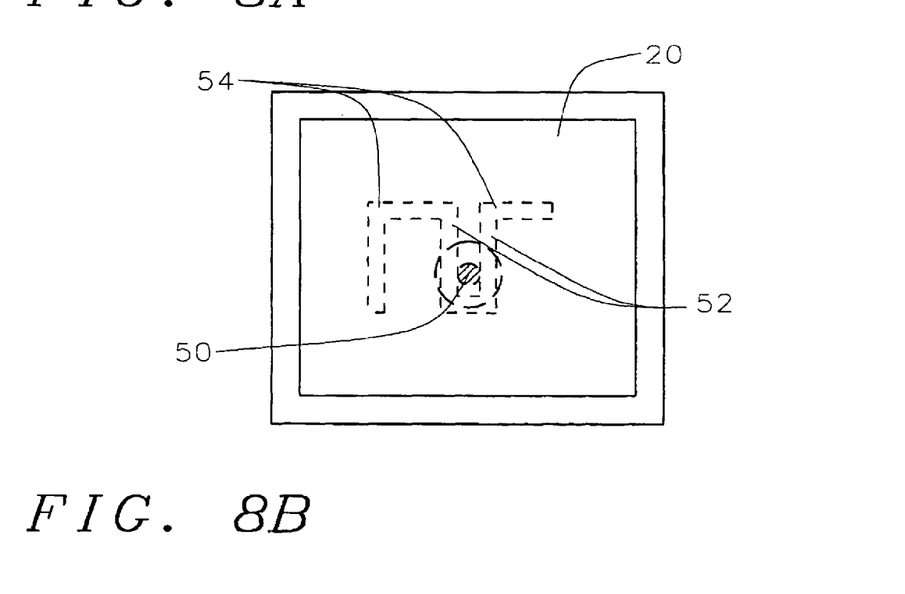
FIG. 8B is a top view of FIG. 8A.

The second objective is achieved by exciting orthogonal modes in the dielectric resonator with equal magnitude. The required phase shift of 90° between the modes occurs due to an asymmetrical design of the feed that leads to a slight difference in the resonant frequency of the dielectric resonator modes in orthogonal directions. An example of the preferred feed design is given in FIGS. 8A and 8B. FIG. 8A shows the ground planes 31 and 33 on the upper and lower surfaces, respectively, of the feed substrate 30. The RF chip 32 is mounted on the ground plane 33 on the lower surface of the feed substrate. The dielectric resonator 20, shown in top view in FIG. 8B, is attached to a ground plane 31 from the side of the feed structure. The feed consists of a coplanar waveguide 52 and a slotted dipole 54 with a bent folder. The dipole with the bent folder excites the modes in the dielectric resonator in orthogonal directions. The length and position of the folders is chosen to provide equal magnitude of the excited orthogonal modes.

Since the total length of the slots (CPW 52 and bent dipole 54) placed under the dielectric resonator is different in orthogonal directions, the resonant frequencies of the resonator in orthogonal directions will be also different. The required difference in the resonant frequencies is achieved by choosing the appropriate length of the CPW under the dielectric resonator. The via connection is connected to a central conductor of the CPW at the upper end of the via and the lower end of the via is connected to the RF chip with a wire (line 40). The feed substrate 30 is mechanically fixed on the resonator surface. The feed structure 52/54 excites the dielectric resonator providing coupling of RF in/out of the RF chip to a dielectric resonator mode.

Figure 9A:
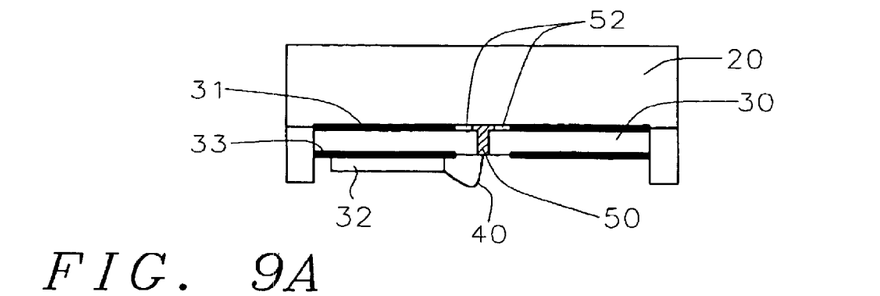
FIG. 9A is a cross-sectional representation of a dielectric resonator antenna with linear polarization of the present invention.
Figure 9B:
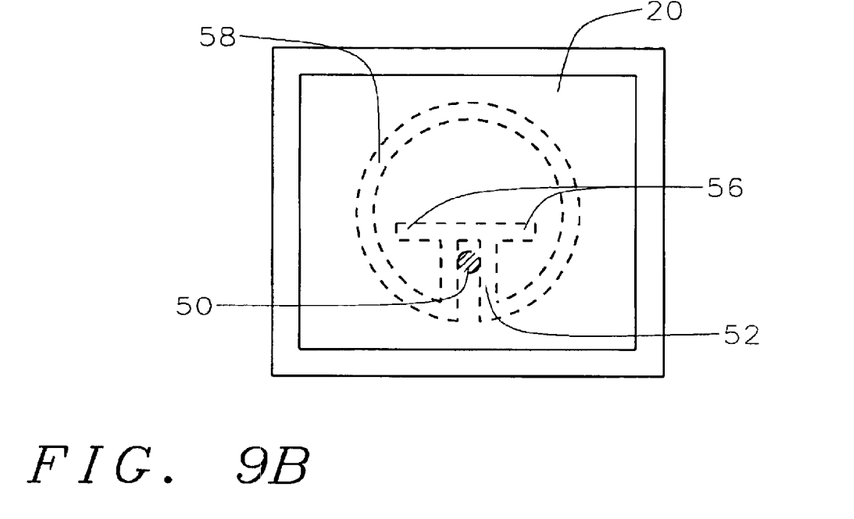
FIG. 9B is a top view of FIG. 9A.

A third objective of this invention is to provide a linear polarized radiation from the dielectric resonator antenna and to achieve a wider impedance bandwidth with a simple feed design. The third objective is achieved by using a feed comprising a complementary pair of magnetic and electric dipoles. The use of both magnetic and electric dipoles allows the formation of a unidirectional radiation pattern with a maximum of the radiation directed away from the RF chip and allows improvement of the impedance bandwidth of the antenna. An example of the preferred feed design is shown in FIG. 9B. The feed consists of a slotted ring 58 (equivalent electric dipole), a slotted dipole 56 (equivalent magnetic dipole) and a coplanar waveguide 54. The coplanar waveguide is coupled to the rest of RF circuitry through a via 50 in the feed substrate 30. Due to a slight difference in the resonant frequencies of the ring and the dipole the overall impedance bandwidth of the feed is increased considerably. The results of computer simulation of the proposed structure show the achievable bandwidth more than 8% in comparison with conventional <3% bandwidth of a dielectric antenna with linear polarization. Also, the proposed structure exhibits the radiation pattern with forward-to-backward ratio better than 10 dB, which allows minimization of the unwanted feedback to RF circuitry and reduction of the requirements on the ground plane size.

Figure 10:
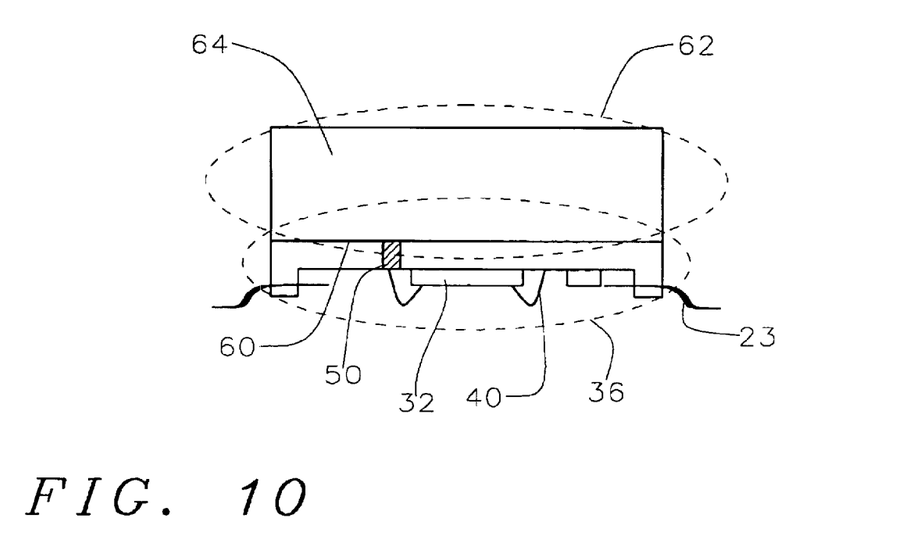
FIG. 10 is a cross-sectional representation of a multi layer dielectric resonator package of the present invention.

The preferred embodiments of the present invention described thus far can be modified in a variety of ways to achieve further objectives of the invention. An example of a multilayer dielectric resonator package is shown in FIG. 10. In this design, an RF micromodule 36 is assembled in a lower part of the package made of dielectric material of relatively low dielectric constant and small losses at the operating frequency. The lower part of the package also is used as a feed substrate, while the feed structure 60 is fabricated directly on the top of the lower part of the package and is connected to the RF circuitry 32 through a via 50. The upper part of the multi layer dielectric resonator package 62 made of dielectric materials with a relatively high dielectric constant is fixed directly on the side of the feed structure 60. The requirement that the dielectric constant of the lower part of the package should be smaller than the dielectric constant of the upper part of the package provides an effective excitation of the dielectric resonator with the feed structure.

For example, a standard RF package made of LTCC material (a ceramic material with low dielectric constant, commonly used in the fabrication of RF packages) with slight modifications may be used in that design as a lower part of the dielectric resonator package. The modifications include metallization of the outer side of the package with subsequent fabrication of the feed structure, fabrication of the via hole, metallization of the via and etching the lower ground plane in the area surrounding the via.

Figure 11A:
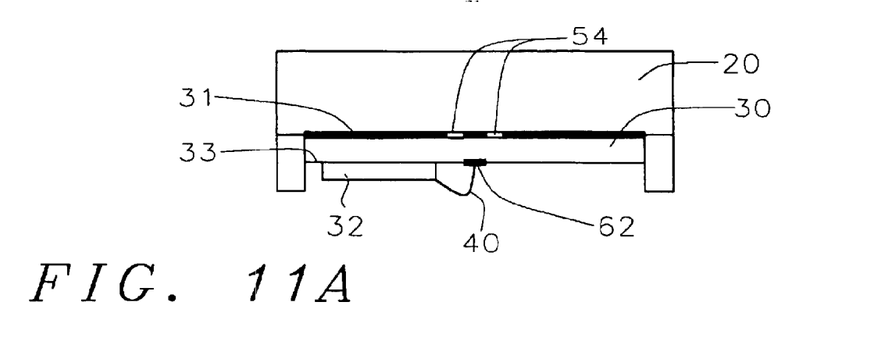
FIG. 11A is a cross-sectional representation of a dielectric resonator package of the present invention.
Figure 11B:
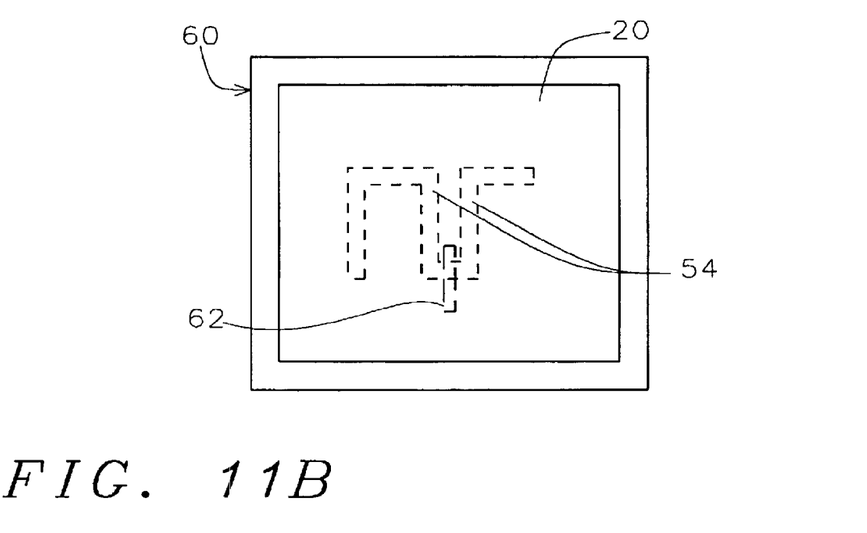
FIG. 11B is a top view of FIG. 11A.

An example of a design with the feed coupled to the RF circuitry through an aperture is shown in FIG. 11. In that case the dielectric resonator package and the feed structure design are as given in FIGS. 6, 7, 8, 9, and 10. However, the coupling of the feed structure 60 to the RF chip 32 is done with a microstrip line 62 placed on the lower side of the feed substrate 30, rather than through a via in the feed substrate as it was shown in FIGS. 6–10.

Figure 12:
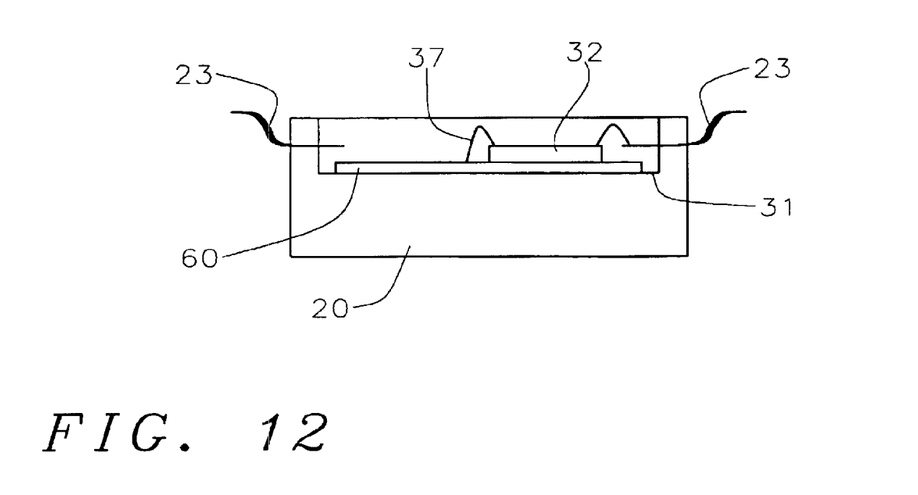
FIG. 12 is a cross-sectional representation of a dielectric resonator package of the present invention.

An example of a dielectric resonator package without a feed substrate is shown in FIG. 12. The feed structure 60 is fabricated directly on the inner surface of the dielectric resonator package 20 through an appropriate metallization. The RF chip 32 and the other components of the system, not shown, are mounted directly on the feed ground plane 31 as it is shown in FIG. 12 forming a package integrated RF micromodule. The RF in/out 37 of the RF chip 32 is connected to the feed structure 60 at the same points as the via connection shown in FIGS. 6–10. The RF chip ground pads are connected to the feed structure ground plane.

Figure 13:
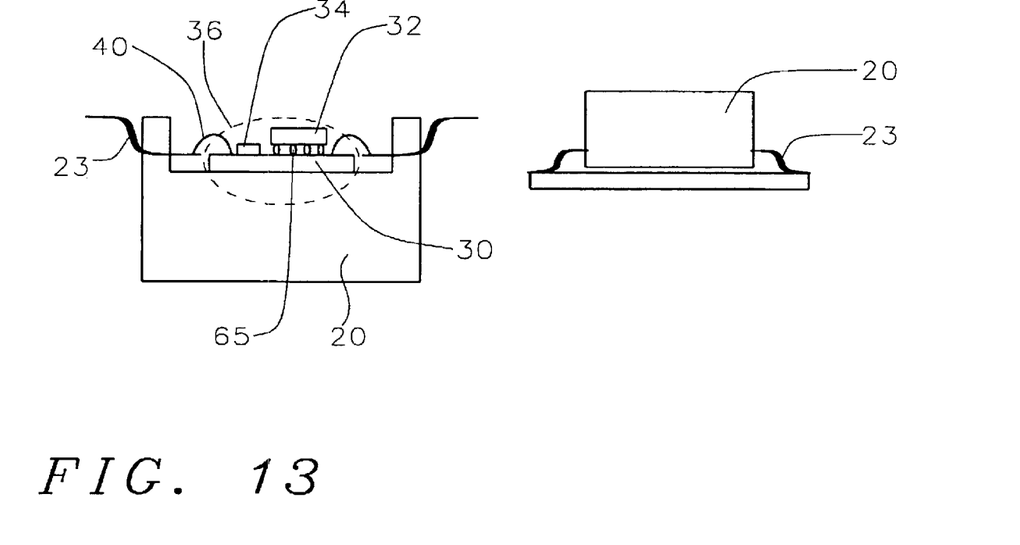
FIG. 13 is a cross-sectional representation of a stand alone dielectric resonator package of the present invention.
Figure 14:
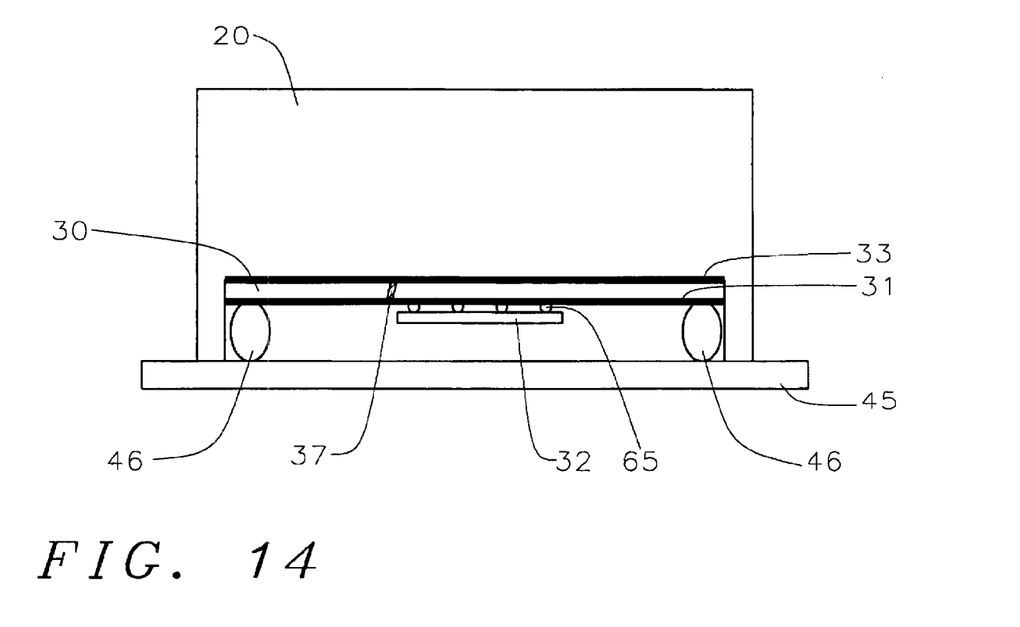
FIG. 14 is a cross-sectional representation of a dielectric resonator package of the present invention on a printed circuit board.

An example of dielectric resonator package design suitable for microwave and extremely high frequencies is presented in FIG. 13 and FIG. 14 showing the design of a standalone package and a package on a PCB, respectively. The RF chip 32 is connected to a feed substrate 30 with a flip-chip type of connection, rather than wire bonding connections.

The present invention provides an RF system in a dielectric resonator package concept. The Dielectric Resonator package of the present invention achieves high radiation efficiency with a wide impedance bandwidth. Both circular and linear polarized radiation can be achieved with simple feed designs.

While the invention has been particularly shown and described with reference to the preferred embodiments thereof, it will be understood by those skilled in the art that various changes in form and details may be made without departing from the spirit and scope of the invention.

What is claimed is:

1. A dielectric resonator package comprising:
   a dielectric resonator formed by a dielectric body of said dielectric resonator package and resonating at a radio frequency;
   a feed substrate having an upper and a lower surface;
   a first ground plane formed on said upper surface of said feed substrate and a second ground plane formed on said lower surface of said feed substrate;
   a feed structure formed on said upper surface of said feed substrate wherein said feed substrate is attached inside of said dielectric body of said package from a side of said feed structure; and
   radio frequency circuitry mounted on said lower surface of said feed substrate.

2. The package according to claim 1 wherein said dielectric resonator antenna has a high dielectric constant.

3. The package according to claim 1 wherein said dielectric resonator antenna has a symmetrical or asymmetrical shape.

4. The package according to claim 1 wherein said package is a stand alone package and wherein leads provide an electrical interface of operating at frequencies lower than said radio frequency.

5. The package according to claim 1 wherein said package is mounted on a printed circuit board.

6. The package according to claim 1 wherein said radio frequency circuitry is mounted on said lower surface of said feed substrate by wire bonding.

7. The package according to claim 1 wherein said radio frequency circuitry is mounted on said lower surface of said feed substrate by a flip-chip type connection.

8. A dielectric resonator antenna comprising:
   a feed substrate having an upper and a lower surface;
   a first ground plane formed on said upper surface of said feed substrate and a second ground plane formed on said lower surface of said feed substrate;
   a dielectric resonator formed on said first ground plane;
   an asymmetrical feed structure formed on said first ground plane wherein said asymmetrical feed structure excites modes in said dielectric resonator in orthogonal directions to provide circular polarized radiation; and
   radio frequency circuitry mounted on said lower surface of said feed substrate and coupled to said feed structure.

9. The antenna according to claim 8 wherein said asymmetrical feed comprises:
   a coplanar waveguide; and
   a slot dipole having a bent folder.

10. The antenna according to claim 8 wherein said radio frequency circuitry is coupled to said feed structure by a via through said feed substrate.

11. The antenna according to claim 8 wherein said radio frequency circuitry is coupled to said feed structure by a microstrip line placed on said lower surface of said feed substrate.

12. The antenna according to claim 8 wherein said dielectric resonator comprises a dielectric body of a package for said radio frequency circuitry.

13. The antenna according to claim 12 wherein said feed substrate is mechanically attached to said dielectric body of said package from a side of said feed structure.

14. A dielectric resonator antenna comprising:
   a feed substrate having an upper and a lower surface;
   a first ground plane formed on said upper surface of said feed substrate and a second ground plane formed on said lower surface of said feed substrate;
   a dielectric resonator formed on said first ground plane;
   a feed structure formed on said first ground plane wherein said feed structure comprises both magnetic and electric dipoles to provide linear polarized radiation; and
   radio frequency circuitry mounted on said lower surface of said feed substrate and connected to said feed structure by a via through said feed substrate.

15. The antenna according to claim 14 wherein said feed structure comprises:
   a coplanar waveguide;
   a slotted ring forming an equivalent electric dipole; and
   a slotted dipole forming an equivalent magnetic dipole.

16. The antenna according to claim 14 wherein said radio frequency circuitry is coupled to said feed structure by a via through said feed substrate.

17. The antenna according to claim 14 wherein said radio frequency circuitry is coupled to said feed structure by a microstrip line placed on said lower surface of said feed substrate.

18. The antenna according to claim 14 wherein said dielectric resonator comprises a dielectric body of a package for said radio frequency circuitry.

19. The antenna according to claim 18 wherein said feed substrate is mechanically attached to said dielectric body of said package from a side of said feed structure.

20. A dielectric resonator package comprising:
a radio frequency micromodule assembled in a lower part of said package made of a dielectric material having a low dielectric constant;
a feed substrate comprising a portion of said lower part of said package;
a first ground plane formed on an upper surface of said feed substrate and a second ground plane formed on a lower surface of said feed substrate;
radio frequency circuitry mounted on said lower surface of said feed substrate in said radio frequency micromodule;
a feed structure formed on said first ground plane on top of said lower part of said package and connected to said radio frequency circuitry through a via; and
an upper part of said package comprising a dielectric resonator made of dielectric material having a high dielectric constant mounted on a side of said feed structure.

21. A dielectric resonator package comprising:
a feed ground plane having an upper and lower surface;
a first ground plane formed on said upper surface of said feed substrate and a second ground plane formed on said lower surface of said feed substrate;
radio frequency circuitry mounted on said lower surface of said feed ground plane;
a feed structure form on an upper surface of said feed ground plane; and
a dielectric resonator contacting said feed structure on said upper surface of said feed ground plane.

22. The package according to claim 21 wherein said dielectric resonator comprises a dielectric body of said package.

23. The package according to claim 21 wherein said radio frequency circuitry is connected to said feed structure by wire bonding.

24. The package according to claim 21 wherein said radio frequency circuitry is connected to said feed structure by flip chip.

25. The package according to claim 21 wherein ground pads of said radio frequency circuitry are connected to said feed ground plane.

* * * * *